(12) United States Patent
Park et al.

(10) Patent No.: US 10,971,308 B2
(45) Date of Patent: Apr. 6, 2021

(54) MULTILAYER CAPACITOR

(71) Applicant: SAMSUNG ELECTRO-MECHANICS CO., LTD., Suwon-si (KR)

(72) Inventors: Byeong Gyu Park, Suwon-si (KR); Yong Jin Yun, Suwon-si (KR); So Ra Kang, Suwon-si (KR); Jae Yeol Choi, Suwon-si (KR)

(73) Assignee: SAMSUNG ELECTRO-MECHANICS CO., LTD, Suwon-si (KR)

( * ) Notice: Subject to any disclaimer, the term of this patent is extended or adjusted under 35 U.S.C. 154(b) by 71 days.

(21) Appl. No.: 16/219,755

(22) Filed: Dec. 13, 2018

(65) Prior Publication Data

US 2020/0027661 A1     Jan. 23, 2020

(30) Foreign Application Priority Data

Jul. 20, 2018    (KR) .................. 10-2018-0084786
Oct. 5, 2018    (KR) .................. 10-2018-011905 8

(51) Int. Cl.
     *H01G 4/30*      (2006.01)
     *H01G 4/12*      (2006.01)
     (Continued)

(52) U.S. Cl.
     CPC ............. *H01G 4/30* (2013.01); *H01G 2/065* (2013.01); *H01G 4/012* (2013.01); *H01G 4/12* (2013.01); *H05K 2201/10015* (2013.01)

(58) Field of Classification Search
     CPC ........ H01G 4/012; H01G 4/1227; H01G 4/33; H01G 4/248; H01G 4/0085; H01G 4/232;
     (Continued)

(56) References Cited

U.S. PATENT DOCUMENTS 9,099,247 B1 *   8/2015   Kitano ................. H01G 4/1227
2012/0229950 A1    9/2012   Kim et al.
(Continued)

FOREIGN PATENT DOCUMENTS

JP      2000-124057 A     4/2000
KR     10-1141342          4/2012
(Continued)

OTHER PUBLICATIONS

Korean Office Action dated Nov. 28, 2019 issued in Korean Patent Application No. 10-2018-0119058 (with English translation).

*Primary Examiner* — Michael P McFadden
(74) *Attorney, Agent, or Firm* — Morgan, Lewis & Bockius LLP (57) ABSTRACT

A multilayer capacitor includes a body and external electrodes on external surfaces of the body. The body includes a plurality of internal electrodes alternately laminated with dielectric layers. The external electrodes are electrically connected to the internal electrodes. Edges of cover portions of the body are rounded. The rounded edges have a radius of curvature R and the body has a thickness T, such that R and T satisfy 10 µm≤R≤T/4. Among the plurality of internal electrodes, an internal electrode in each of the cover portions has a width less than that of an internal electrode of the central portion.

27 Claims, 8 Drawing Sheets

(51) Int. Cl.
*H01G 2/06* (2006.01)
*H01G 4/012* (2006.01)

(58) Field of Classification Search
CPC ............ H01G 4/30; H01G 2/065; H01G 4/12; H05K 2201/10015
See application file for complete search history.

(56) References Cited

U.S. PATENT DOCUMENTS

| | | |
|---|---|---|
| 2014/0307362 A1 | 10/2014 | Kim et al. |
| 2014/0311783 A1 | 10/2014 | Lee et al. |
| 2015/0021073 A1* | 1/2015 | Kim ................. H01G 2/065 174/258 |
| 2016/0196918 A1* | 7/2016 | Hong ................ H01G 4/232 174/260 |
| 2017/0040111 A1 | 2/2017 | Kim et al. |
| 2017/0301471 A1* | 10/2017 | Ono ..................... H01G 4/12 |
| 2018/0166217 A1* | 6/2018 | Kato .................. H01G 4/2325 |
| 2019/0164693 A1* | 5/2019 | Ono .................... H01G 4/012 |

FOREIGN PATENT DOCUMENTS

| | | |
|---|---|---|
| KR | 10-2014-0124298 A | 10/2014 |
| KR | 10-2014-0124657 A | 10/2014 |
| KR | 10-2015-0011263 A | 1/2015 |
| KR | 10-1701049 B1 | 1/2017 |

* cited by examiner

MULTILAYER CAPACITOR

CROSS-REFERENCE TO RELATED APPLICATION(S)

This application claims benefit of priority to Korean Patent Application Nos. 10-2018-0084786 filed on Jul. 20, 2018 and 10-2018-0119058 filed on Oct. 5, 2018 in the Korean Intellectual Property Office, the disclosures of which are incorporated herein by reference in their entirety.

BACKGROUND

1. Field

The present disclosure relates to a multilayer capacitor.

2. Description of Related Art

A capacitor is an element capable of storing electricity. When a voltage is applied to electrodes opposing each other, an electrical charge is accumulated in each of the electrodes. When a direct current (DC) voltage is applied, electricity accumulates as current flows in the capacitor, until accumulation is completed and no more current flows in the capacitor. On the other hand, when an alternating current (AC) voltage is applied, AC current continues to flow, while polarities of the electrodes alternate.

Capacitors are classified according to the type of an insulators provided between electrodes. Capacitors can be aluminum electrolytic capacitors in which aluminum electrodes are configured and a thin oxide film is provided between the aluminum electrodes, tantalum capacitors that use tantalum as an electrode material, ceramic capacitors that use a high-k dielectric material such as barium titanate between electrodes, multilayer ceramic capacitors (MLCCs) in which high-k ceramics having a lamination structure are used as a dielectric material provided between electrodes, film capacitors using a polystyrene film as a dielectric material between electrodes, and the like.

MLCCs have the advantage of excellent temperature and frequency characteristics and may be realized at a small size. MLCCs have recently been commonly applied to devices within various fields, such as high frequency circuits.

In an MLCC according to a related art, a plurality of dielectric sheets may be laminated to form a lamination structure, external electrodes having opposite polarities may be formed on external surfaces of the multilayer body, respectively, and internal electrodes may be alternately laminated in the lamination structure to be electrically connected to the external electrodes, respectively.

As electronic products have increasingly been miniaturized and highly integrated, research into the miniaturization and high integration of MLCCs has been actively undertaken. In the case of MLCCs, various attempts have been made to improve the connectivity of internal electrodes, while thinning the dielectric layers, to laminate more dielectric layers and thereby increase capacitance and reduce the size of the capacitor.

For example, the ends of the internal electrodes can be bent to fill the step, and margin portions eliminate voids caused by a step due to recession of a cover and a decreased margin width. A capacitive layer is also stretched by the margin width reduced as the voids due to the step are eliminated. The irregular structural stretching of the internal electrodes results in a reduction of reliability such as breakdown voltage (BDV) characteristics, and the like, of an MLCC.

As a solution to address the above disadvantages, a method of attaching a side margin portion after cutting both side surfaces of a body in a length direction has been developed. However, complex fabrication processes lead to low productivity. Moreover, when the side margin portion is formed to have a small thickness, the thickness of a corner margin portion may also be decreased and degrade humidity resistance reliability.

SUMMARY

An aspect of the present disclosure is to provide a multilayer capacitor securing humidity resistance reliability while significantly increasing an effective volume.

According to an aspect of the present disclosure, a multilayer capacitor includes a body and external electrodes disposed on external surfaces of the body. The body includes a lamination structure with a plurality of internal electrodes alternately laminated with dielectric layers interposed therebetween. The external electrodes are electrically connected to the internal electrodes. The body includes a central portion and cover portions, above and below the central portion in a lamination direction of the dielectric layers. The cover portions of the body have rounded edges. The body has a thickness T, and each of the rounded edges has a radius of curvature R that satisfies the relationship 10 μm≤R≤T/4. Among the plurality of internal electrodes, an internal electrode in each of the cover portions has a width less than that of an internal electrode in the central portion.

Among the plurality of internal electrodes, internal electrodes in the cover portions may decrease in width as a function of their closeness to a surface of the body.

The plurality of internal electrodes may include first and second internal electrodes respectively exposed at first and second surfaces of the body opposing each other in a length direction. The widths of the plurality of internal electrodes may be measured in a width direction substantially perpendicular to the length direction.

The body may have a third surface and a fourth surface, opposing each other in the lamination direction of the plurality of dielectric layers. The body may have a fifth surface and a sixth surface connected to the first to fourth surfaces and opposing each other.

The rounded edges of the cover portions may be where the third surface is connected to the fifth and sixth surfaces, and where the fourth surface is connected to the fifth and sixth surfaces.

When a smallest distance from the surface of the body to an internal electrode is referred to as a margin, a margin δ at each of rounded edges in the cover portions may be greater than or equal to a margin Wg at the fifth and sixth surfaces.

The margins δ and Wg may satisfy 1≤δ/Wg≤1.2.
The margin Wg may satisfy 0.5 μm≤Wg≤T/12.
The margin Wg may satisfy 0.5 μm≤Wg≤15 μm.
The third and fourth surfaces may have a margin Tg satisfying Wg≤Tg.

The rounded edges of the respective cover portions may have a radius of curvature R satisfying 10 μm R 60 μm.

A virtual surface defined by end portions of the plurality of internal electrodes may have rounded edges, and the rounded edges may each have a radius of curvature equal to the respective rounded edge of the cover portions.

The rounded edges of the virtual surface may have a radius of curvature less than that of the respective rounded edge of the cover portions.

When a smallest distance from a surface of the body to an internal electrode is referred to as a margin, a radius of curvature "R" of a rounded edge in cover portions may be equal to the sum of the margin "δ" of the rounded edge and a radius of curvature "r" of the virtual surface.

A margin region surrounding the dielectric layers where they are interposed between internal electrodes may have a lower level of compactness than elsewhere.

The margin region may include at least two regions with different levels of compactness. The compactness of the inner dielectric region adjacent to internal electrode region may be higher than the compactness of an outer dielectric region surrounding the inner dielectric region.

According to an aspect of the present disclosure, a multilayer capacitor may include a body and external electrodes disposed on external surfaces of the body. The body may include a plurality of internal electrodes alternately laminated with dielectric layers interposed therebetween. The external electrodes may be electrically connected to the internal electrodes. The body may include a central portion, and cover portions above and below the central portion in a lamination direction of the plurality of the dielectric layers. The cover portions of the body may have rounded edges. A virtual surface defined by end portions of the plurality of internal electrodes may also have rounded edges in the cover portions.

The rounded edges of the virtual surface may face corresponding rounded edges of the cover portions.

The rounded edges of the virtual surface may each have a radius of curvature equal to the radius of curvature of a corresponding rounded edge of the cover portions.

The rounded edges of the virtual surface may each have a radius of curvature less than the radius of curvature of a corresponding rounded edge of the cover portions.

When a smallest distance from a surface of the body to an internal electrode is referred to as a margin, a radius of curvature "R" of a rounded edge of the cover portions may be substantially equal to the sum of the margin "δ" of the rounded edge of the cover portion and a radius of curvature "r" of the virtual surface.

BRIEF DESCRIPTION OF DRAWINGS

The above and other aspects, features, and advantages of the present disclosure will be more clearly understood from the following detailed description, taken in conjunction with the accompanying drawings, in which.

DETAILED DESCRIPTION

Hereinafter, embodiments of the present disclosure will be described as follows with reference to the attached drawings.

The present disclosure may, however, be exemplified in many different forms and should not be construed as being limited to the specific embodiments set forth herein.

Rather, these embodiments are provided to convey the scope of the disclosure to those skilled in the art.

In the drawings, the shapes and dimensions of elements may be exaggerated for clarity.

Further, in the drawings, elements having the same functions within the same scope of the inventive concept may be designated by the same reference numerals.

Figure 1:
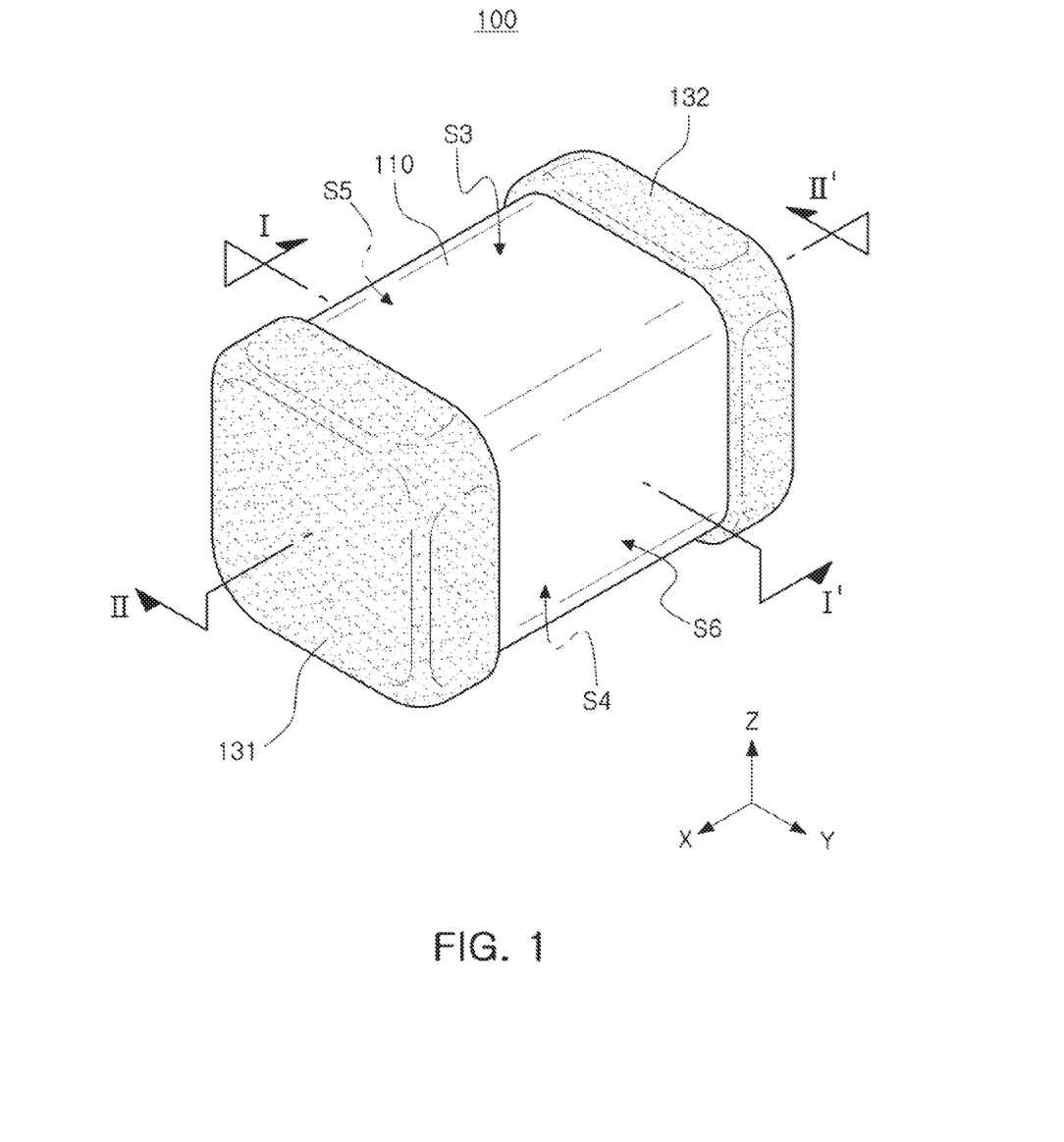
FIG. 1 is a schematic perspective view of a multilayer capacitor according to an exemplary embodiment in the present disclosure.
Figure 2:
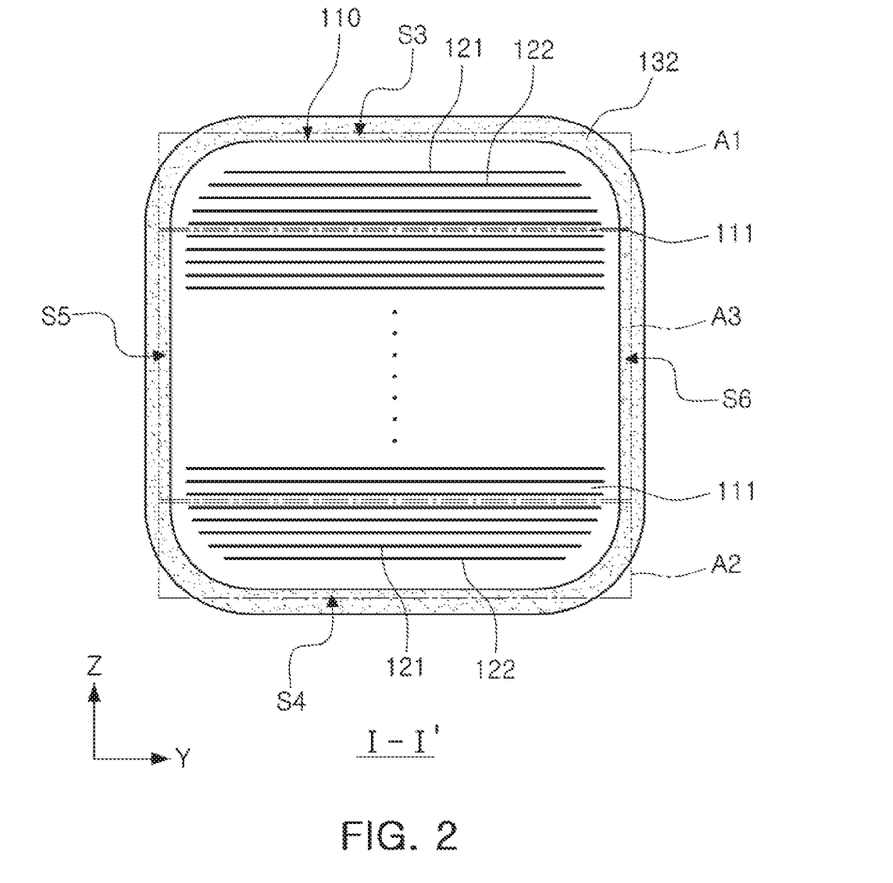
FIG. 2 is a cross-sectional view taken along line I-I' in FIG. 1.
Figure 3:
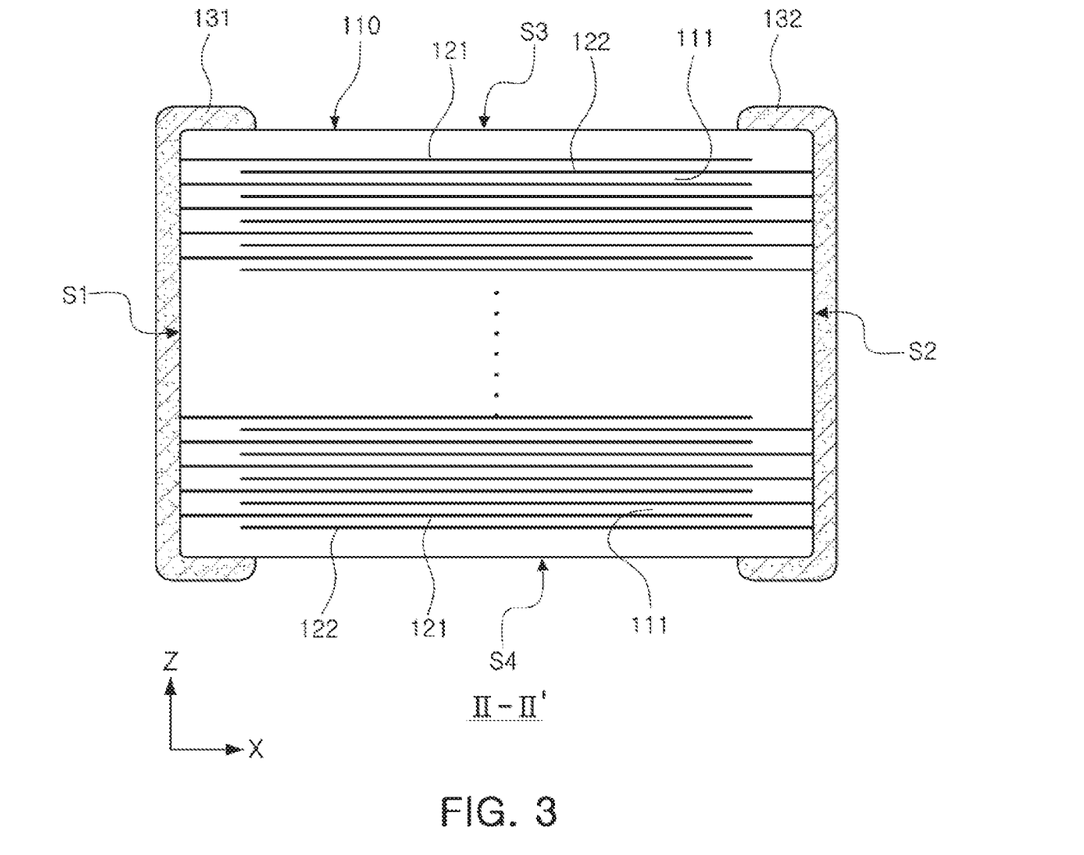
FIG. 3 is a cross-sectional view taken along line II-II' in FIG. 1.
Figure 4:
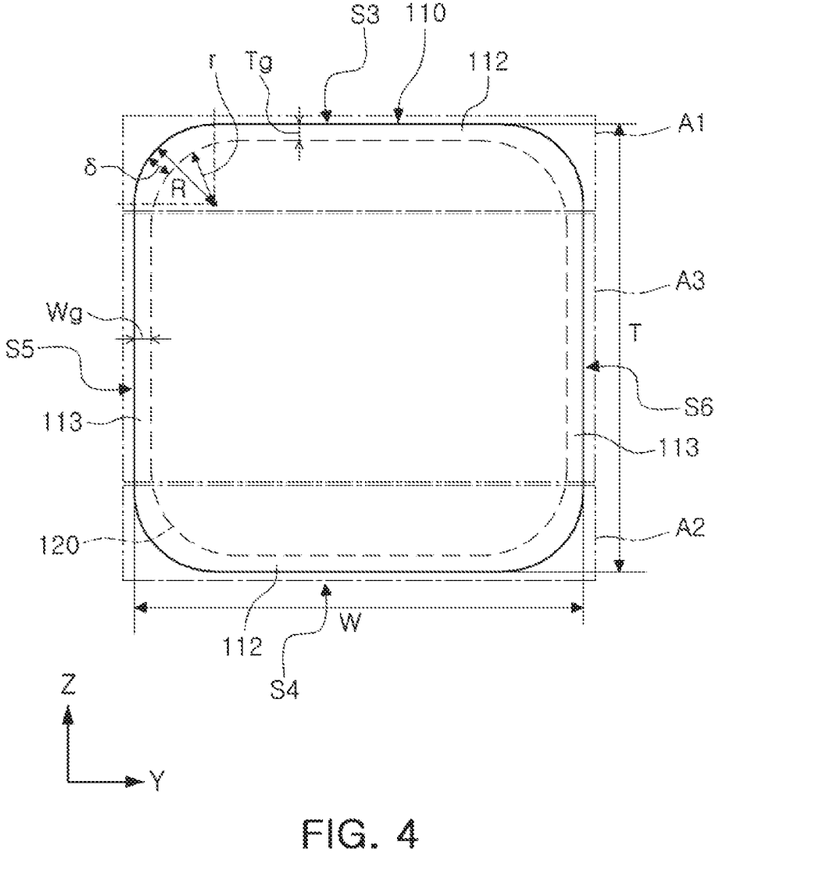
FIG. 4 is a contour of regions of a cross-sectional view taken along line I-I' in FIG. 1.

FIG. 1 is a schematic perspective view of a multilayer capacitor according to an exemplary embodiment in the present disclosure. FIG. 2 is a cross-sectional view taken along line I-I' in FIG. 1. FIG. 3 is a cross-sectional view taken along line II-II' in FIG. 1. FIG. 4 is a contour of regions of a cross-sectional view taken along line I-I' in FIG. 1.

Referring to FIGS. 1 to 4, a multilayer capacitor 100 according to an exemplary embodiment includes a body 110 and external electrodes 131 and 132. The body includes dielectric layers 111 and a plurality of internal electrodes 121 and 122. The internal electrodes 121 and 122 are laminated with dielectric layers 111 interposed therebetween. In the body 110, upper and lower cover portions A1 and A2 have rounded edges. Among the plurality of internal electrodes 121 and 122, internal electrodes in the cover portions A1 and A2 may have widths less than the widths of the internal electrodes in the central portion A3.

The body 110 is formed by laminating a plurality of dielectric layers 111, for example, laminating a plurality of green sheets and sintering the laminated green sheets. The plurality of dielectric layers 111 may be integrated with each other by such a sintering process. The shapes and dimensions of the body 110 and the number of the laminated dielectric layers 111 are not limited to those of the present embodiment. The body 110 may be in the form of, for example, a plurality of laminated dielectric layers 111 and may have, for example, a hexahedral shape, as shown in FIG. 1.

The body 110 may have a first surface S1 and a second surface S2 at which the internal electrodes 121 and 122 are exposed, respectively. The first and second surfaces S1 and S2 may oppose each other in a length direction (the X direction in the figures). The body may have a third surface S3 and a fourth surface S4 opposing each other in a lamination direction (the Z direction in the figures) of the plurality of dielectric layers 111. The body may have a fifth surface S5 and a sixth surface S6 opposing each other in a width direction (the Y direction in the figures).

The dielectric layers 111 included in the body 110 may include a ceramic material having a high dielectric constant, for example, BT-based materials such as barium titanate ($BaTiO_3$)-based materials, but other materials may also be used if they can obtain sufficient capacitance. The dielectric layer 111 may further include additives, organic solvents, plasticizers, binders, dispersing agents, and the like together with such a ceramic material, which is a main material, as needed. The additives may include metallic ingredients and may be added in the form of a metal oxide during a manufacturing process. The metal oxide may include at least one of, for example, $MnO_2$, $DY_2O_3$, $BaO$, $MgO$, $Al_2O_3$, $SiO_2$, $Cr_2O_3$, and $CaCO_3$.

The plurality of internal electrodes 121 and 122 may be obtained by printing a paste containing a conductive metal to have a predetermined thickness and sintering the printed paste. The plurality of internal electrodes 121 and 122 may include first and second internal electrodes 121 and 122 respectively exposed at the first and second surfaces S1 and S2. The first and second internal electrodes 121 and 122 may be respectively connected to external electrodes 131 and 132, to have polarities opposite to each other. The first and second internal electrodes 121 and 122 may be electrically insulated from each other by dielectric layers 111 interposed therebetween. However, the number of the external electrodes 131 and 132 or manner of their connection to the internal electrodes 121 and 122 may vary. The main material of the internal electrodes 121 and 122 may be, for example, nickel (Ni), copper (Cu), palladium (Pd), silver (Ag), or alloys thereof.

The external electrodes 131 and 132 may be disposed on external surfaces of the body 110, respectively, and may include first and second external electrodes 131 and 132 electrically connected to the first and second internal electrodes 121 and 122, respectively. The external electrodes 131 and 132 may be formed by applying a paste, prepared using a material containing a conductive metal, to the body 110. The conductive metal may be, for example, nickel (Ni), copper (Cu), palladium (Pd), gold (Au), or alloys thereof. The external electrodes 131 and 132 may additionally include a plating layer to mount the multilayer capacitor 100 on a board.

In the present embodiment, the edges of the body 110 are rounded to suppress a chipping defect, and the internal electrodes 121 and 122 disposed in the cover portions A1 and A2 of the body 110 have relatively smaller widths than internal electrodes 121 and 122 disposed in the central portion A3. A smallest distance from a surface of the body 110 to a portion of an internal electrode closest to the surface can be referred to as a margin. The margin in the rounded edges of the cover portions A1 and A2 may be greater than or equal to a margin in the central portion A3. A virtual surface 120 may be defined by connecting end portions of the plurality of internal electrodes 121 and 122. The virtual surface may have rounded edges in the cover portions A1 and A2.

In the body 110 according to the present embodiment, the size of the margins, radii of curvature of the rounded edges, body thickness, body length, and the like are optimized. This structure can achieve high-level capacitance while allowing for miniaturization of the multilayer capacitor 100. Furthermore, humidity resistance reliability may be improved.

The body 110 includes a central portion A3 and cover portions A1 and A2. The cover portions A1 and A2 are above and below the central portion A3 in the lamination direction (Z direction). Internal electrodes 121 and 122 are in the cover portions A1 and A2 and in the central portion A3. The internal electrodes in the cover portions A1 and A2 may have smaller widths than the internal electrodes in the central portion A3. As shown in FIG. 2, the internal electrodes 121 and 122 in the cover portions A1 and A2 may have widths that decrease as they are closer to a surface of the body 110. The widths of the internal electrodes 121 and 122 may be defined as distances in the width direction (Y direction), which is a direction that is substantially perpendicular to the length direction in which the first and second surfaces S1 and S2 oppose each other(X direction) and is also substantially perpendicular to the lamination direction of the dielectric layers 111 (Z direction).

As described above, the body 110 has rounded edges in the cover portions A1 and A2, which reduces a chipping defect of the multilayer capacitor 100. Specifically, in the upper cover portion A1, edges at which the third surface S3 is connected to the fifth surface S5 and the sixth surface S6 may be rounded (upper rounded edges in FIG. 2) and, in the lower cover portion A2, edges at which the fourth surface S4 is connected to the fifth surface S5 and the sixth surface S6 (lower rounded edges in FIG. 2) may be rounded.

Hereinafter, optimal conditions, such as the size of the margins, the radius of curvature of a rounded edge, the body thickness and length, and the like, will be described with reference to FIG. 4. In FIG. 4, the internal electrode region in which internal electrodes are interposed with dielectric layers is a region within the virtual surface 120. In this case, the lamination direction (Z direction) is used to define the thickness "T" of the body 110 and the width direction (Y direction) is used to define the width "W" of the body 110.

A margin of the body 110 may be defined as a distance from a surface of the body 110 to an internal electrode closest to the surface, or to the internal electrode region corresponding to the virtual surface 120. The margin of each rounded edge in the cover portions A1 and A2 is denoted by δ, and the margin at each of the fifth and sixth surfaces S5 and S6 is denoted by Wg, corresponding to a width-direction margin of the body 110. In the present embodiment, the margin δ of the rounded edge is greater than or equal to the width-direction margin Wg. In the related art, internal electrodes are not aligned with each other, which makes it difficult to form a width-direction margin. To address the issue, a separate process is typically performed to form the width direction margin. In such a related art structure, it is difficult to sufficiently secure the margin of a rounded edge of the body 110. Moreover, when the body 110 is miniaturized and the number of laminated internal electrodes increases, humidity resistance reliability is degraded.

In the present embodiment, the widths of the internal electrodes 121 and the 122 in the cover portions A1 and A2 are such that they correspond to the rounded edges of the body 110. Due to such shapes, the margin δ of the rounded edge may be sufficiently secured and be greater than or equal to the width-direction margin Wg. In more detail, the margin δ of the rounded edge and the width-direction margin Wg may satisfy $1 \leq \delta/Wg \leq 1.2$. When the margin δ of the rounded edge is 1.2 times greater than the width-direction margin Wg, the widths of the internal electrodes 121 and 122 of the cover portions A1 and A2 may be significantly decreased and reduce capacitance.

As the margin δ of the rounded edge is increased, the humidity resistance reliability may also be improved in the miniaturized body 110. Thus, the body 110 may include a larger number of internal electrodes 121 and 122 to implement improved capacitance. The capacitance is improved by, for example, increasing the effective volume of the body 110.

In the case of the present embodiment, the widths of the internal electrodes 121 and 122 in the central portion A3 may be uniform. This may be achieved by a process of cutting a ceramic lamination structure into individual chip units. The uniformity of the widths may be determined based on the locations of respective end portions of the internal electrodes 121 and 122. For example, based on the width direction (the Y direction), the deviation of the locations of the end portions of the internal electrodes 121 and 122 may be less than or equal to 0.1 micrometers (μm).

A margin of the body 110 in the lamination direction (also called a thickness direction), for example, a thickness-direction margin Tg of the third surface S3 and the fourth surface S4, may satisfy $Wg \leq Tg$. The thickness-direction margin Tg and the width-direction margin Wg may be formed by the same process. A dielectric layer, corresponding to a base layer for a cover margin, may be disposed above the uppermost internal electrode and below the lowermost internal electrode, and as a result the thickness-direction margin Tg may be slightly greater than the width-direction margin Wg. The width-direction margin Wg may satisfy 0.5 µm≤Wg≤15 µm, and may be designed to secure humidity resistance reliability of the body 110 and sufficiently secure capacitance. Similarly, the thickness-direction margin Tg may satisfy 0.5 µm≤Tg≤15 µm. The width-direction margin Wg may be set in consideration of a thickness T of the body 110 and, in detail, may satisfy 0.5 µm≤Wg≤T/12. For example, the thickness of the body 110 may be about 200 µm to about 400 µm.

The radius of curvature R of each rounded edge in the cover portions A1 and A2 may be designed withstand chipping caused by a weight of the multilayer capacitor 100 and a load during a process. In detail, the radius of curvature R may be set in consideration of the thickness T of the body 110 and may satisfy 10 µm≤R≤T/4. As set forth above, the thickness T of the body 110 may be, for example, about 200 µm to about 400 µm. In this case, a rounded edge of the internal electrode region 120 in the cover portions A1 and A2 may have substantially the same rounded shape, for example, substantially the same radius of curvature as the rounded edge of the body 110. The internal electrode region may be a region within a virtual surface 120 defined by connecting end portions of the internal electrodes 121 and 122 in the cover portions A1 and A2 in a lamination direction of the internal electrodes 121 and 122. As illustrated, the rounded edges of the internal electrode region 120 may face corresponding rounded edges of the cover portions A1 and A2.

As illustrated in FIG. 4, the radius of curvature r of the rounded edges of the virtual surface 120 may be less than the radius of curvature R of the rounded edges of the cover portions A1 and A2. In this case, the radii of the curvature r and R may share a center with each other.

The radius of curvature R of each rounded edge of the cover portion A1 and A2 may be equal to a value obtained by adding the margin δ at the rounded edge to the radius of the curvature r of the corresponding rounded edge of the virtual surface 120.

Contour regions surrounding the plurality of internal electrodes 121 and 122 in the body 110, for example, regions surrounding the internal electrode region 120 in FIG. 4, can be referred to as margin regions 112 and 113. In addition, the margin regions 112 and 113 may collectively be referred to as a margin region. The level of compactness of the dielectric material may be lower in the margin regions 112 and 113 than in the other regions, such as in the internal electrode region 120. The margin regions 112 and 113 may be obtained by forming a ceramic lamination structure and coating the ceramic lamination structure. The difference in compactness between the margin regions 112 and 113 may result from a difference in the manufacturing method. It will be appreciated that the term "level of compactness" (or "compactness") is inversely proportional to a density of voids present therein.

Figure 5:
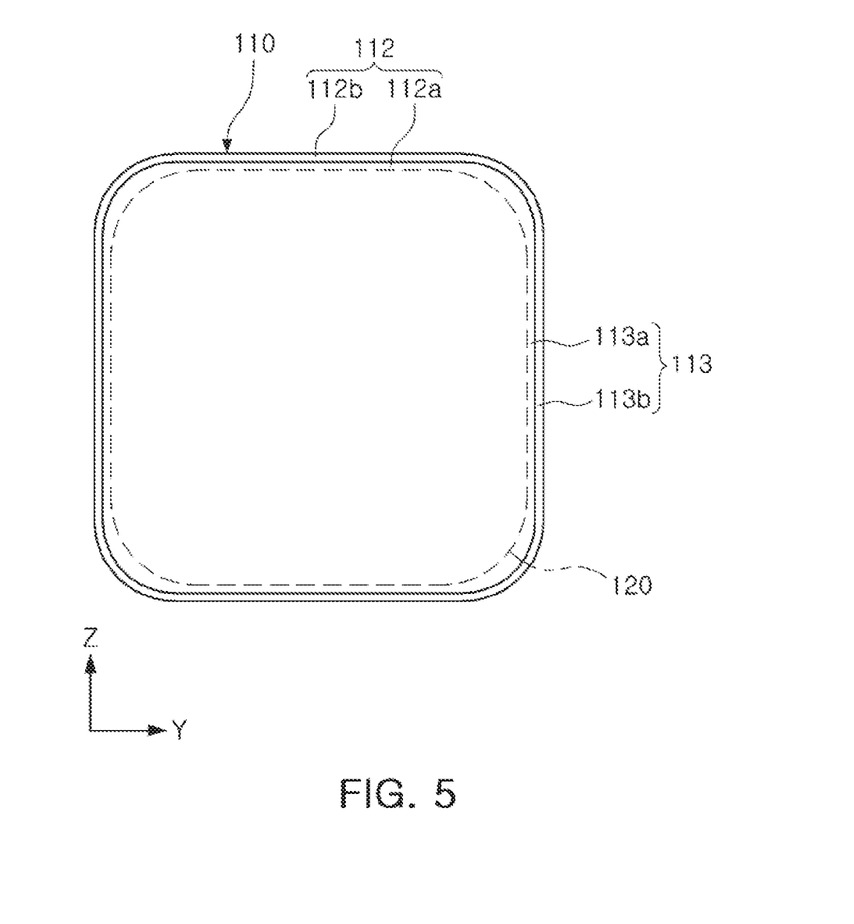
FIG. 5 illustrates a shape of a body adaptable to a modified embodiment.

As shown in FIG. 5, margin regions 112 and 113 may each include two layers in which the dielectric material has different levels of compactness. For example, the thickness margin regions 112 may each include a first layer 112a and a second layer 112b, and the side margin regions 113 may each include a first layer 113a and a second layer 113b. The level of compactness of the dielectric layers 111 interposed between the plurality of internal electrodes in the internal electrode region 120 may be higher than the dielectric material in the margin regions 112 and 113.

An exemplary manufacturing method will be described with reference to FIGS. 6 to 8.

Figure 6:
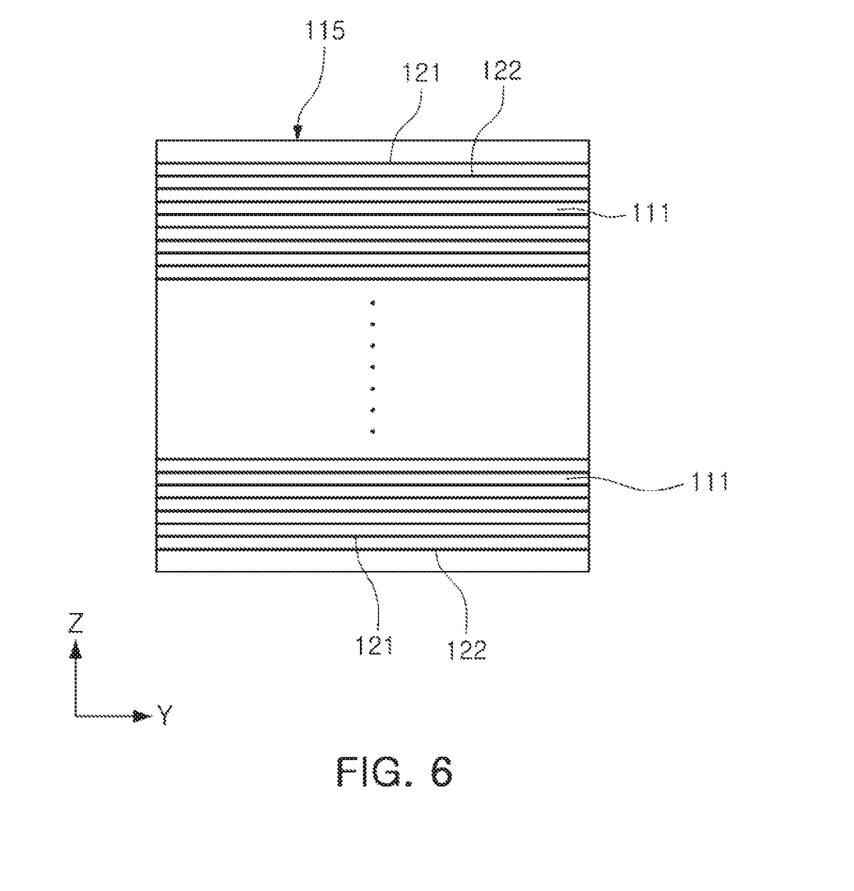
FIGS. 6 to 8 illustrate processes of manufacturing a multilayer capacitor according to an exemplary embodiment in the present disclosure.

As illustrated in FIG. 6, dielectric layers 111 and internal electrodes 121 and 122 are laminated to prepare a ceramic lamination structure 115. The dielectric layers 111 are in a ceramic green sheet state because they are not sintered yet. The ceramic green sheets can be manufactured by mixing ceramic powder particles, a binder, a solvent, and the like to produce a slurry and forming the slurry into sheets having a thickness of a few micrometers using a doctor blade method.

A conductive paste for an internal electrode may be applied to surfaces of the ceramic green sheets to form first and second internal electrode patterns. The first and second internal electrode patterns may be formed using a screen printing method. The conductive paste for an internal electrode may include a metal and nickel. The conductive paste for an internal electrode may include a conductive metal and an additive, where the additive may be at least one of a base metal and a metal oxide. The conductive metal may include nickel. The additive may include barium titanate or strontium titanate. The ceramic lamination structure 115 may be implemented by laminating a plurality of green sheets on which internal electrode patterns are formed and pressurizing the laminated green sheets. Then, the ceramic lamination structure 115 may be divided into individual chip units, if necessary. In this case, the internal electrodes 121 and 122 may be exposed to be connected to external electrodes. Due to the cutting process, the exposed internal electrodes 121 and 122 may have uniform widths. For example, a difference between a maximum width and a minimum width of the internal electrodes 121 and 122 may be less than 0.1 µm. In FIG. 6, dielectric layers 111 corresponding to base layers for a cover margin are laminated on internal electrodes 121 and 122 disposed on uppermost and lowermost portions. However, such a base layer for a cover may be significantly reduced, if desired. For example, such a base layer may have the same thickness as the dielectric layer 111 between the internal electrodes 121 and 122.

Figure 7:
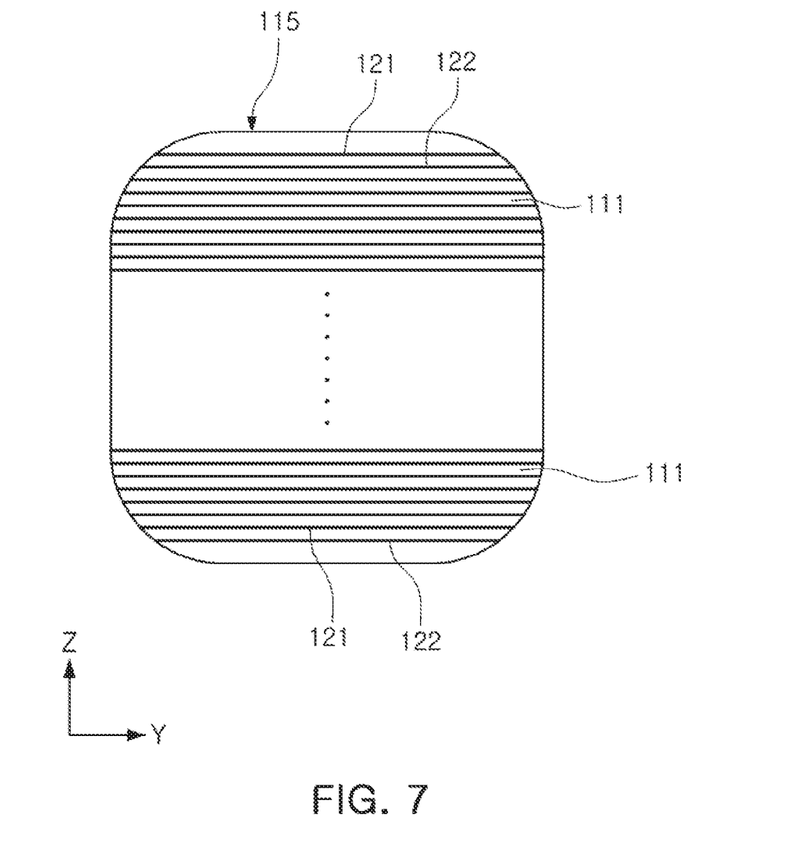

As illustrated in FIG. 7, edges of the ceramic lamination structure 115 may be polished to be rounded. Specifically, both the internal electrodes 121 and 122 disposed on uppermost and lowermost portions (corresponding to the cover portion of the body described above) may be polished to be exposed from the ceramic lamination structure 115. Due to the polishing process, among the plurality of internal electrodes 121 and 122, an internal electrode disposed in the cover portion of the body may have a width less than a width of an internal electrode disposed in a central portion of the body. In the case of the present process of polishing the edges of the ceramic lamination structure 115, barrel polishing or the like may be used.

Figure 8:
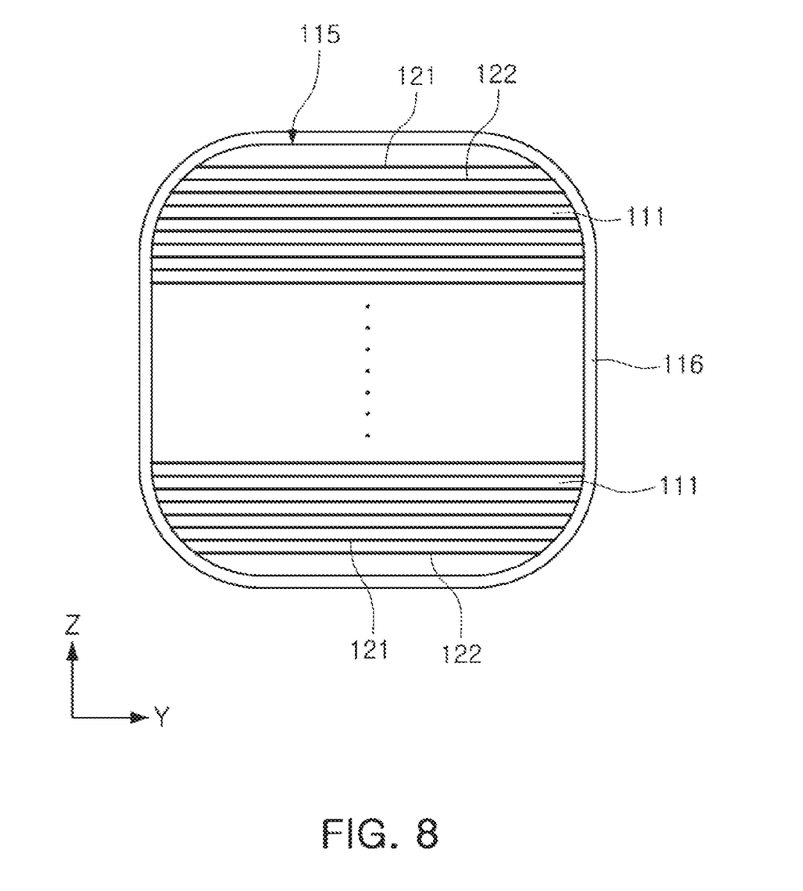

As illustrated in FIG. 8, a coating film 116 is formed on the surface of the ceramic lamination structure 115 to constitute at least a portion of the margin region of the body described above. As an exemplary process, the coating film 116 may be formed by applying the same material as a material of the dielectric layer 111 to the surface of the ceramic lamination structure 115. The coating film 116 may be coated on an entire surface of the ceramic lamination structure 115, and the coating process may be, for example, a process of injecting a dielectric slurry using a spray. By forming the separate coating film 116 after manufacturing the ceramic lamination structure 115, a margin region of the body may be formed to be uniform and thin. A sufficiently thick margin may thus be obtained in an edge region having low humidity resistance. Additionally, since the coating film 116 is formed along the surface of the ceramic lamination structure 115, the coating film 116 may naturally have rounded edges. In this case, an additional process of forming rounded edges may thus be omitted. Accordingly, the rounded edges of the coating film 116 and the rounded edges of the ceramic lamination structure 115 may be disposed to face each other and may have the same curvature.

The ceramic lamination structure 115 may be sintered while applying the coating film 116. When the coating film 116 is applied to the entire surface of the ceramic lamination structure 115, a portion of the coating film 116 may be removed through surface polishing to expose the internal electrodes 121 and 122. The surface polishing may be performed using a polishing process, a grinding process, or the like.

As described above, a multilayer capacitor according to an exemplary embodiment may secure high capacitance while being advantageous for miniaturization and may have improved reliability due to improved humidity resistance characteristics thereof.

While exemplary embodiments have been shown and described above, it will be apparent to those skilled in the art that modifications and variations could be made without departing from the scope of the present invention as defined by the appended claims.

What is claimed is:

1. A multilayer capacitor comprising:
   a body including a plurality of internal electrodes alternately laminated with dielectric layers interposed therebetween in a lamination direction; and
   external electrodes on external surfaces of the body and electrically connected to respective internal electrodes of the plurality of internal electrodes,
   wherein the body includes a central portion, an upper cover portion above the central portion in the lamination direction, and a lower cover portion below the central portion in the lamination direction,
   wherein the upper and lower cover portions have rounded edges extending from upper and lower surfaces of the body, respectively, to opposing side surfaces of the body to define respective upper and lower rounded regions in the lamination direction,
   wherein the body has a thickness T in the lamination direction and each of the rounded edges has a respective radius of curvature R that satisfies 10 µm≤R≤T/4,
   wherein a first internal electrode of the plurality of internal electrodes in the upper cover portion has a first width in a width direction, substantially perpendicular to the lamination direction, a second internal electrode of the plurality of internal electrodes in the lower cover portion has a second width in the width direction, a third internal electrode of the plurality of internal electrodes in the central portion has a third width in the width direction, and the first and second widths are each less than the third width,
   wherein at least one of the first internal electrode or the second internal electrode is arranged in the upper rounded region or the lower rounded region, respectively,
   wherein a margin region, between the plurality of internal electrodes and a side surface of the body in the width direction, includes an inner dielectric region with a first compactness and an outer dielectric region, closer to the plurality of internal electrodes than the outer layer of dielectric, with a second compactness, and
   the first compactness of the inner dielectric region is greater than the second compactness of the outer dielectric region.

2. The multilayer capacitor of claim 1,
   wherein the upper and lower cover portions each include internal electrodes with respective widths that decrease as they are closer to respective upper and lower surfaces of the body in the lamination direction, and
   wherein the central portion includes internal electrodes with respective widths that are substantially equal to each other.

3. The multilayer capacitor of claim 1, wherein the plurality of internal electrodes include internal electrodes respectively exposed at first and second surfaces of the body opposing each other in a length direction substantially perpendicular to both the lamination and width directions.

4. The multilayer capacitor of claim 3, wherein the body has a third surface and a fourth surface, opposing each other in the lamination direction, and a fifth surface and a sixth surface connected to the first to fourth surfaces and opposing each other in the width direction.

5. The multilayer capacitor of claim 4, wherein the rounded edges are located where the third surface is connected to the fifth and sixth surfaces and where the fourth surface is connected to the fifth and sixth surfaces.

6. The multilayer capacitor of claim 5, wherein a first margin δ, which is a smallest distance from an internal electrode of the plurality of internal electrodes to one of the rounded edges, is greater than or equal to a second margin Wg, which is a distance in the width direction between an internal electrode in the central portion of the plurality of internal electrodes, to the fifth or sixth surfaces.

7. The multilayer capacitor of claim 6, wherein 6 and Wg satisfy 1≤δ/Wg≤1.2.

8. The multilayer capacitor of claim 6, wherein Wg satisfies 0.5 µm≤Wg≤T/12.

9. The multilayer capacitor of claim 6, wherein Wg satisfies 0.5 µm≤Wg≤15 µm.

10. The multilayer capacitor of claim 6, wherein a third margin Tg, which is a smallest distance between an uppermost or lowermost internal electrode of the plurality of internal electrodes and the third or fourth surfaces, satisfies Wg≤Tg.

11. The multilayer capacitor of claim 1, wherein the rounded edges have respective radii of curvature R satisfying 10 µm≤R≤60 µm.

12. The multilayer capacitor of claim 1, wherein a virtual surface defined by end portions of the plurality of internal electrodes in the upper and lower cover portions has rounded edges, and
   the rounded edges of the virtual surface each have a respective radius of curvature that is substantially equal to the respective radius of curvature of a nearest rounded edge of the upper or lower cover portions.

13. The multilayer capacitor of claim 1, wherein a virtual surface defined by end portions of the plurality of internal electrodes in the upper and lower cover portions has rounded edges, and
   the rounded edges of the virtual surface each have a respective radius of curvature that is less than the respective radius of curvature of the nearest rounded edge of the upper or lower cover portions.

14. The multilayer capacitor of claim 13, wherein when a smallest distance from a surface of the body to an internal electrode, among the plurality of internal electrodes, is referred to as a margin, a first radius of curvature of a rounded edge of one of the cover portions is substantially equal to a sum of the margin and a second radius of curvature of a rounded edge of the virtual surface.

15. The multilayer capacitor of claim 1, wherein a contour region, surrounding the plurality of internal electrodes, of the dielectric layers has a first compactness lower than a second compactness in an internal electrode region, between internal electrodes of the plurality of internal electrodes, of the dielectric layers.

16. A multilayer capacitor comprising:
a body including a plurality of flat internal electrodes alternately laminated with dielectric layers interposed therebetween in a lamination direction; and
external electrodes on external surfaces of the body and electrically connected to respective internal electrodes of the plurality of flat internal electrodes,
wherein the body includes a central portion, an upper cover portion above the central portion in the lamination direction, and a lower cover portion below the central portion in the lamination direction,
wherein the upper and lower cover portions of the body each have rounded edges,
wherein a virtual surface defined by end portions of the plurality of flat internal electrodes in the upper and lower cover portions of the body has rounded edges, and
wherein (1) the rounded edges of the virtual surface each have a radius of curvature less than a radius of curvature of a nearest rounded edge of the upper or lower cover portions, or (2) a first margin, which is a smallest distance from an internal electrode of the plurality of flat internal electrodes to one of the rounded edges of at least one of the upper or lower cover portion, is greater than or equal to a second margin, which is a distance in a width direction between an internal electrode in the central portion of the plurality of flat internal electrodes, to a side surface.

17. The multilayer capacitor of claim 16, wherein the rounded edges of the virtual surface are located facing respective rounded edges of the upper or lower cover portions.

18. The multilayer capacitor of claim 16, wherein the rounded edges of the virtual surface each have a radius of curvature substantially equal to a radius of curvature of a nearest rounded edge of the upper or lower cover portions.

19. The multilayer capacitor of claim 16, wherein when a smallest distance from a surface of the body to an internal electrode, among the plurality of flat internal electrodes, is referred to as a margin, a first radius of curvature of a rounded edge of one of the cover portions is substantially equal to a sum of the margin and a second radius of curvature of a rounded edge of the virtual surface.

20. A multilayer capacitor comprising:
a body comprising a plurality of internal electrodes laminated with dielectric layers therebetween in a lamination direction and including:
a central portion with first and second side surfaces, opposing each other in a width direction perpendicular to the lamination direction, and substantially flat,
an upper cover portion above the central portion in the lamination direction and with first and second side surfaces that are curved from the respective first and second side surfaces of the central portion to an upper surface of the body in the lamination direction, and
a lower cover portion below the central portion in the lamination direction and with first and second side surfaces that are curved from the respective first and second side surfaces of the central portion to a lower surface of the body in the lamination direction; and
an external electrode on the body and electrically connected to the plurality of internal electrodes,
wherein the body has a first thickness in the lamination direction, the upper cover portion has a second thickness in the lamination direction, and the lower cover portion has a third thickness in the lamination direction, and the second and third thicknesses are each less than or equal to one-fourth the first thickness, and
wherein the central portion includes first internal electrodes, of the plurality of internal electrodes, with substantially equal widths in the width direction, and the upper and lower cover portions respectively include second and third internal electrodes, of the plurality of internal electrodes, with widths less than those of the first internal electrodes.

21. The multilayer capacitor of claim 20, wherein the second internal electrodes have respective widths such that their end points are separated from a respective nearest point of a surface of the body by a substantially equal amount.

22. The multilayer capacitor of claim 20,
wherein the curved surfaces of the upper cover portion each have a first radius of curvature,
wherein a virtual surface defined by endpoints of the second internal electrodes has rounded edges each having a second radius of curvature, and
the first radius of curvature is substantially equal to the second radius of curvature.

23. The multilayer capacitor of claim 20, wherein a first margin Wg, which is a distance between the first internal electrodes and respective nearest points of a surface of the body, and a second margin δ, which is a distance between the second internal electrodes and respective nearest points of a surface of the body, satisfy $1 \le \delta/Wg \le 1.2$.

24. A multilayer capacitor comprising:
a body comprising an internal electrode region, including a plurality of internal electrodes laminated with dielectric layers therebetween in a lamination direction, where a surface of the internal electrode region is defined by end points of the plurality of internal electrodes, and a margin region surrounding the internal electrode region in the lamination direction and a width direction substantially perpendicular to the lamination direction; and
an external electrode on the body and electrically connected to the plurality of internal electrodes,
wherein the surface of the internal electrode region includes rounded edges,
wherein the margin region has a first thickness Wg between the surface of the internal electrode region and a side surface of the body substantially parallel to the lamination direction, and a second thickness δ between the surface of the internal electrode region at one of the rounded edges and a nearest point on a surface of the body, and the first and second thicknesses satisfy $1 \le \delta/Wg \le 1.2$.

25. The multilayer capacitor of claim 24, wherein the first thickness Wg is substantially equal to the second thickness δ.

26. The multilayer capacitor of claim 24, wherein the margin region has a third thickness Tg, between the surface of the internal electrode region and an upper surface of the body in the lamination direction, that is greater than or equal to the first thickness Wg.

27. The multilayer capacitor of claim 24,
wherein the margin region includes an inner region surrounding the internal electrode region and an outer region surrounding the inner region, wherein the dielectric layers of the internal electrode region have a first compactness, the inner region has a second compactness lower than the first compactness, and the outer region has a third compactness lower than the second compactness.

\* \* \* \* \*

UNITED STATES PATENT AND TRADEMARK OFFICE
CERTIFICATE OF CORRECTION

PATENT NO. : 10,971,308 B2  
APPLICATION NO. : 16/219755  
DATED : April 6, 2021  
INVENTOR(S) : Park et al.

Page 1 of 1

It is certified that error appears in the above-identified patent and that said Letters Patent is hereby corrected as shown below:

On the Title Page (30) Foreign Application Priority Data:  
"Jul. 20, 2018 (KR) .............................. 10-2018-0084786  
Oct. 5, 2018 (KR) .............................. 10-2018-011905 8"

Should read:  
--Jul. 20, 2018 (KR) .............................. 10-2018-0084786  
Oct. 5, 2018 (KR) .............................. 10-2018-0119058--

Signed and Sealed this  
First Day of June, 2021

Drew Hirshfeld  
*Performing the Functions and Duties of the*  
*Under Secretary of Commerce for Intellectual Property and*  
*Director of the United States Patent and Trademark Office*